United States Patent [19]

Lipowski et al.

[11] Patent Number: 5,526,527
[45] Date of Patent: Jun. 11, 1996

[54] METHOD AND APPARATUS FOR FREQUENCY SYNTHESIZATION IN DIGITAL CORDLESS TELEPHONES

[75] Inventors: Joseph T. Lipowski, Boxborough, Mass.; Bjorn E. Bjerede, La Jolla; John F. O'Connor, San Diego, both of Calif.

[73] Assignee: Pacific Communication Sciences, Inc., San Diego, Calif.

[21] Appl. No.: 131,210

[22] Filed: Oct. 1, 1993

[51] Int. Cl.$^6$ ............................... H04Q 7/32; H03L 7/00
[52] U.S. Cl. .................... 455/183.1; 455/260; 331/11; 379/61
[58] Field of Search ................. 455/182.1, 183.1, 455/192.1, 260; 331/1 A, 18, 11, 1 R, 49; 379/61, 58; 364/718

[56] References Cited

U.S. PATENT DOCUMENTS

| | | | |
|---|---|---|---|
| 4,030,045 | 6/1977 | Clark | 331/1 A |
| 4,078,212 | 3/1978 | Rast | 455/182.1 |
| 4,543,661 | 9/1985 | Defeuilly et al. | 455/183.1 |
| 4,574,307 | 3/1986 | Nillesen | 331/18 |
| 4,659,999 | 4/1987 | Motoyama et al. | 331/2 |
| 4,688,205 | 8/1987 | Abiko | 331/11 |
| 4,773,085 | 9/1988 | Cordell | 331/1 A |
| 4,783,848 | 11/1988 | Ma et al. | 455/183.1 |
| 4,855,683 | 8/1989 | Troudet et al. | 331/11 |
| 4,940,952 | 7/1990 | Kegasa | 331/11 |
| 4,958,310 | 9/1990 | Goldberg | 364/718 |
| 5,042,050 | 8/1991 | Owen | 375/1 |
| 5,257,409 | 10/1993 | Sarocka et al. | 455/260 |
| 5,258,720 | 11/1993 | Tanis et al. | 331/18 |
| 5,270,669 | 12/1993 | Jokura | 455/183.1 |
| 5,297,203 | 3/1994 | Rose et al. | 379/61 |
| 5,410,571 | 4/1995 | Yonekawa et al. | 455/260 X |

OTHER PUBLICATIONS

Philips Semiconductor General Purpose Linear IC Data book, Apr. 1992, pp. 50–52.

*Primary Examiner*—Curtis Kuntz
*Assistant Examiner*—William G. Trost
*Attorney, Agent, or Firm*—Martin J. Jaquez; Merle W. Richman, III

[57] ABSTRACT

Methods and apparatus for frequency synthesization are shown for generating an output signal of desired frequency. The frequency synthesizer includes an oscillator for generating an output signal at the desired frequency in response to a control signal. A first detector compares the output signal to a reference signal and generates a first difference signal representative of the differences, preferably in phase and frequency, between the output and the reference signals. A second detector compares the output signal to the reference signal and generates a second difference signal. A controller generates the control signal in response to either the first or second difference signal. A selector member selects between the first and second detectors to provide either the first or second control signal to the controller in response to a selection signal. A lock detector detects when the output signal and said reference signal are in a predetermined relation and generates the switch signal in response to the detection of the occurrence of such predetermined relation.

24 Claims, 7 Drawing Sheets

METHOD AND APPARATUS FOR FREQUENCY SYNTHESIZATION IN DIGITAL CORDLESS TELEPHONES

FIELD OF THE INVENTION

The present invention relates generally to cordless telephone systems and more particularly to frequency synthesizers utilized in digital cordless telephone systems for locally generating signals having desired frequencies. Such locally generated signals may be used, for example, in channel selection schemes.

BACKGROUND OF THE INVENTION

Presently, the design of cordless telephone systems is based primarily upon techniques for generating a speech representative signal using analog techniques and for transmitting the analog formed signal in accordance with known radio transmission techniques. It will be appreciated that analog techniques for generating speech representative signals are susceptible to interference and noise. Next generation cordless telephones will undoubtedly incorporate digital techniques for generating the speech representative signal, which digital signal would then be converted into analog form for transmission. Such next generation phones have been referred to as digital cordless telephones (DCT) or Personal Hand-Phones (PHP).

As used herein, cordless telephone or digital cordless telephone (DCT) refers to those systems intended for home, public or office use. Such systems typically include a battery powered portable station (handset) and a base station, with the base station being connected into a public telecommunication network. Although the invention may also find use in cellular or mobile phone systems, it is not so described herein.

Transmission standards or specifications have already been developed in both Japan and Europe for use in designing DCT systems. Each of the transmission standards are based on the use of a time division duplex (TDD) format, employing time division duplex for two-way communication. The Japanese DCT transmission standard specifies the use of a plurality of individual carrier signals having a frequency separation of 300 kHz within an overall system bandwidth of about 23 MHz between approximately 1,895 MHz to 1,918 MHz. Each carrier signal should support four channels in a TDMA format employing time division duplex for two-way communication. In particular, for each frame of time (5 ms) there are four transmit time slots (one for each channel) and four receive time slots (one for each channel). Each slot is approximately 625 µs long with a guard time of approximately 30 µs provided within each slot.

By contrast, the European DCT system specifies a series of carriers spaced 1,728 MHz apart within an overall bandwidth of approximately 17.28 MHz. Each carrier is to support twelve full duplex channels, i.e., 12 slots for transmission and 12 slots for reception.

It will be appreciated that the specification of particular transmission standards is only the beginning. Having established the particular parameters in which digital cordless telephone operation can occur, several technical problems arise in relation to the design and selection of components to be used for generation, transmission and reception of speech representative signals. These problems will require resolution in order to achieve the development of digital telephone equipment capable of operation within the parameters of such standards.

One such problem results from the use of the TDMA-duplex scheme. At first glance, such an approach has the appearance of being low cost, however, implementation cost could in fact be high in a fully deployed system. This problem can be appreciated in relation to a DCT system designed for operation in accordance with the Japanese standard. As indicated above, the time format for the Japanese standard specifies eight communication slots per frame wherein each slot will be 625 µs in duration with a guard time of approximately 30 µs included in each slot. The transmit and receive slots are to be grouped four and four, i.e., the first four slots are for transmission and the second four slots are for reception. In order to communicate in all slots, it must be possible to switch between slots in less than the 20 µs guard time. Although such a small switching time is significant in relation to the transmit and receive components of a DCT system, this switching time has an even greater significance with regard to the components used for local frequency generation.

The Japanese standard specifies a differential $\pi/4$-QPSK scheme to generate the modulated speech representative signal. Since such a signal is digital in form, it will be converted to analog form to generate a transmission signal. It will be necessary to modify the frequency of the transmission signal upward in order to transmit this signal at the proper carrier frequency. A reference signal would most likely be combined in a mixer device with the transmission signal in order to modify upward the frequency of the transmission signal to the desired carrier frequency. It will be appreciated that the reference signal must have a sufficiently high frequency for the mixer to produce the desired carrier frequency, since the resulting carrier frequency will be equal to the frequency sum and/or difference. Additionally, signal reception will most likely include some form of heterodyne reception. In that situation, the carrier frequency of the received signal would be modified downward by mixing the received signal with a signal having a known frequency producing a received signal having a frequency equal to the frequency difference.

If a frequency synthesizer is utilized to generate signals having the necessary frequencies for use in such transmission and reception schemes, the ability of the synthesizer to switch from the generation of one frequency to another must be on the order of 30 µs or better. One way to resolve the synthesizer switching time problem would be to transmit and receive at the same frequency. In such a situation it would only be necessary to switch the synthesizer frequency if it were desired to transmit and receive on a different channel. However, receiving and transmitting at the same frequency would result in a still further problem, namely, local transmissions interfering with reception. Consequently, a need exists for a frequency synthesizer capable of switching from one frequency to another within 30 µs or better.

A technique of the present invention to minimize the time utilized by a frequency synthesizer to reliably generate a signal of a desired frequency is the use of multiple phase detectors. Multiple detectors have been used in the past, but not in the arrangement of the present invention.

U.S. Pat. No. 3,660,781—Tewksbury et al. discloses a frequency synthesizer with two phase locking loops. The output of a voltage controlled oscillator (VCO) is provided to a counter that divides the frequency of the VCO output by an integer "N." The output of the divider is applied to a phase detector where it is compared to a reference signal. A signal representative of the differences between the divider output and the reference signal is provided to a switch for possible use as the VCO input. The VCO output and the reference signal are also provided to a sample circuit. The sample circuit is said to sample the VCO output which sampling is regulated by the frequency of the reference signal. The output of the sample circuit is provided to the switch. In response to a control signal generated by a monostable multivibrator (one-shot) the switch provides either the output of the phase detector or the sample circuit to the VCO. The one-shot is triggered by either a change in the integer used in the divider or by a manual trigger signal. As can be appreciated, the one-shot device causes the switch to provide the phase detector output to the VCO during only a desired period of time.

Due to the fixed nature of the phase detector use, this synthesizer is incapable of use in a DCT environment. Since a relatively large number of channels will be available in DCT, setting of a fixed time period is impractical.

U.S. Pat. No. 4,345,219—Jackson discloses a frequency synthesizer having a hold-sample-hold phase detector. The output of the VCO is provided to a divider. A phase frequency detector compares the output of the divider with a reference frequency. The output of the detector serves to set the level of charge to be impressed upon a first hold circuit. When the charge level on the first hold circuit is reached, this charge is sampled and held in a second hold circuit. This sampled voltage drives an amplifier, the output of which is provided as the VCO input. It will be understood that while this circuit employs both phase frequency and sample-hold circuitry that only the phase frequency detector compares the VCO output with a reference signal. Consequently, the ability of this synthesizer to produce a stable output is dependent on only the characteristics of the single phase frequency detector.

U.S. Pat. No. 4,890,071—Curtis discloses a signal generator using a combined phase lock and frequency lock loops. However, only the phase detector compares the VCO output with a reference signal.

U.S. Pat. No. 5,057,793—Cowley et al. discloses a frequency synthesizer having digital and analog phase detectors. The digital detector compares a VCO output signal and a reference signal generating an output representative of any phase difference between these signals. The digital detector output is provided to a charge pump and to an analog phase detector. The analog detector provides an output based on a sampling and holding of the digital detector output. Similar to the other references described above, only the first detector actually compares the VCO output with a reference signal.

Accordingly, a need still exists for a digital cordless telephone system that meets the requirements of DCT standards, that minimizes the time to provide a stabilized output signal and which is capable of switching from a first frequency to a second frequency within 30 μs or better.

SUMMARY OF THE INVENTION

The previously described problems are overcome and the objects and advantages of the invention are achieved in an apparatus and method for digital cordless telephone systems. In accordance with the invention, such systems include a frequency synthesizer for generating an output signal of desired frequency. The synthesizer includes an oscillator for generating the output signal in response to a control signal, a first detector for comparing the output signal to a reference signal and for generating a first difference signal representative of differences between the output and reference signals. A second detector also compares the output signal to said reference signal and for generating a second difference signal representative of differences between the output and reference signals. A controller generates the control signal in response to either the first or second difference signal. A selector member selects between the first and second detectors to provide either the first or second difference signal to the controller in response to a selection signal. A lock detector detects when the output signal and the reference signal are in a predetermined relation and generates the selection signal in response to detecting the occurrence of such predetermined relation. In an especially preferred embodiment, the oscillator, the first and second detectors, the controller, the switch and the lock detector are all formed on a single integrated circuit chip.

In one embodiment of the invention, the lock detector generates a signal indicating a lock condition and a switching circuit generates the selection signal when the lock condition is indicated for a predetermined period. In such an embodiment, it is preferred for the switching circuit to sample the signal representative of a lock condition in response to the reference signal.

It is preferable for the first detector to be a phase/frequency detector for detecting both phase and frequency differences between the output signal and the reference signal and for the second detector to include a sample and hold detector for detecting the phase difference between the output signal and the reference signal. In such an embodiment, a ramp generator generates a ramping voltage, wherein the second detector detects phase differences by sampling the ramping voltage in response to each cycle of the reference signal and the output signal. It is also preferred for the synthesizer to include a divider for modifying the frequency of the output signal by a desired ratio. It is especially preferred for the divider to be a dual modulus frequency divider.

In a still further embodiment the lock detector includes a phase frequency detector. In such a situation the selection signal is generated in response to the detection of predetermined phase and frequency differences.

In order to reduce spurious noise, the first and second difference signals are differential signals having first and second components. In this embodiment, the controller is an operational amplifier connected to receive the first and second components.

In order to balance or null out any reactive components that may be present in the voltage controlled oscillator, a tunable tank circuit is provided.

In a further embodiment of the invention, a pair of the above described synthesizers are combined. In this embodiment, a switch switches between the synthesizers in response to a control signal to provide the output of one synthesizer as the overall output. A controller determines when to switch between the first and second frequencies and generates the switch control signal in response to this determination. It is preferred for each of the synthesizers to be programmable so that the frequencies generated by each can be controlled by a programming signal. In such a case, each of the first and second frequency generators include a memory for storage of frequency information. Such memories can include shift registers, whereby data is provided to shift registers in response to an enablement signal by either tri-state devices or a logic network.

The invention as described herein will achieve its potential in a digital cordless telephone system.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 1:
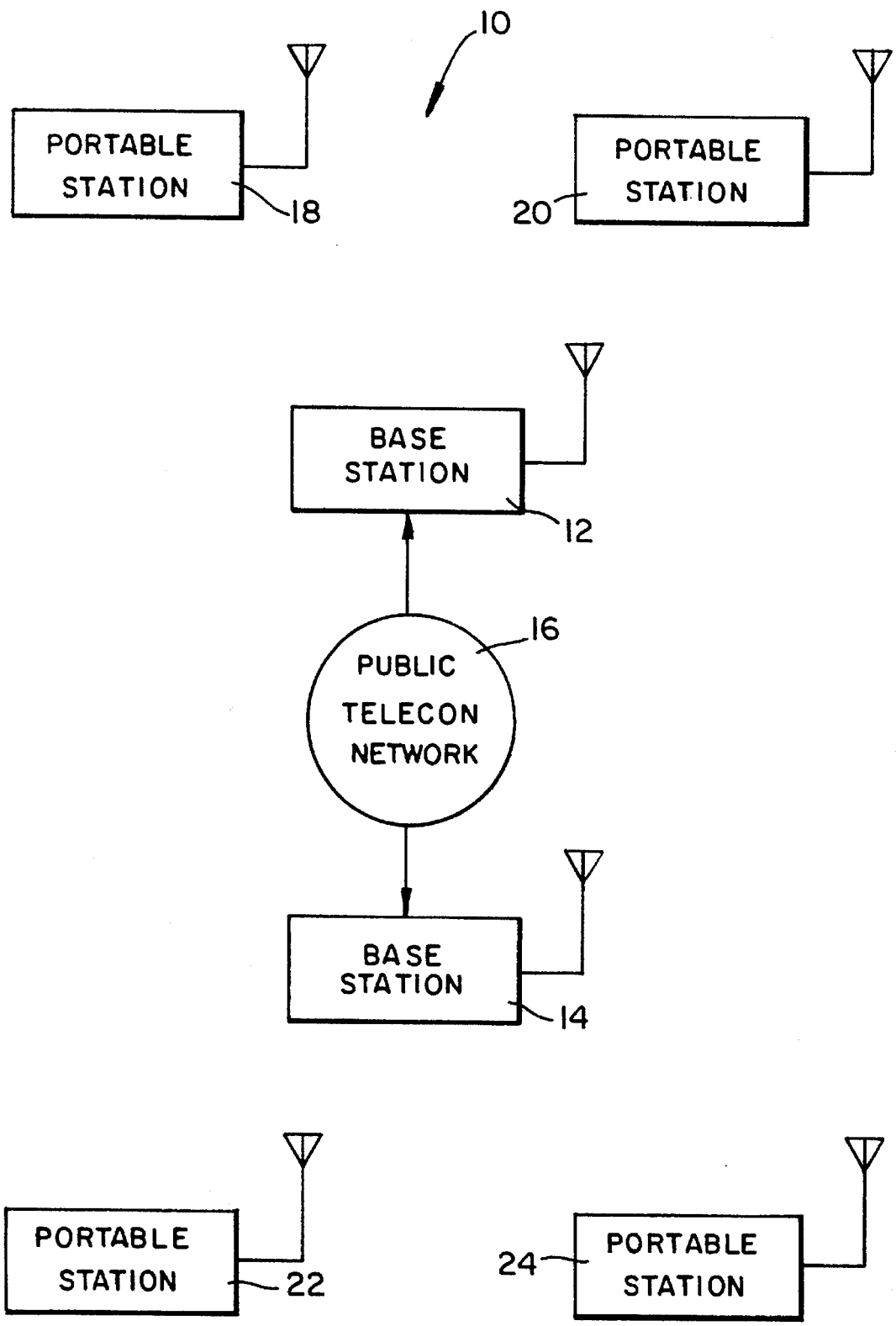
FIG. 1 is a block diagram of a digital cordless telephone system constructed in accordance with the present invention.

A DCT system constructed in accordance with the present invention is shown in FIG. 1 and generally designated 10. DCT system 10 includes two base stations 12 and 14, each of which are adapted for connection to public telecommunications network 16. Portable stations 18 and 20, associated with base station 12, and portable stations 22 and 24, associated with base station 14, provide two-way cordless communication, i.e. a person using portable station 18 can have a conversation with a person using portable station 24. Portable stations 18 through 24 are preferably in the form of a battery-operated handset. Although the invention may be useful in portable stations capable of transmitting signals over several miles, it is described herein in terms of units adapted for transmitting signals within about 100 feet between base station and portable station.

Furthermore, the invention will be described herein in terms of its use in the Japanese system specification described previously. It is noted that this specified system is also referred to as the Personal Hand-Phone (PHP) system. It will be recalled that the Japanese standard specifies the use of a plurality of individual carrier signals having a frequency separation of at least 300 kHz within an overall system bandwidth of about 23 MHz between approximately 1,895 MHz to 1,918 MHz. Each carrier signal should support four channels in a TDD format employing time division duplex for two-way communication.

It is noted that the internal structure of handsets 18 through 24 are identical, i.e. only the frequencies or time slots at which these handsets transmit and receive will be different. Consequently, only the internal structure of portable station 24 will be described. Such internal structure is generally depicted in FIG. 2.

Figure 2:
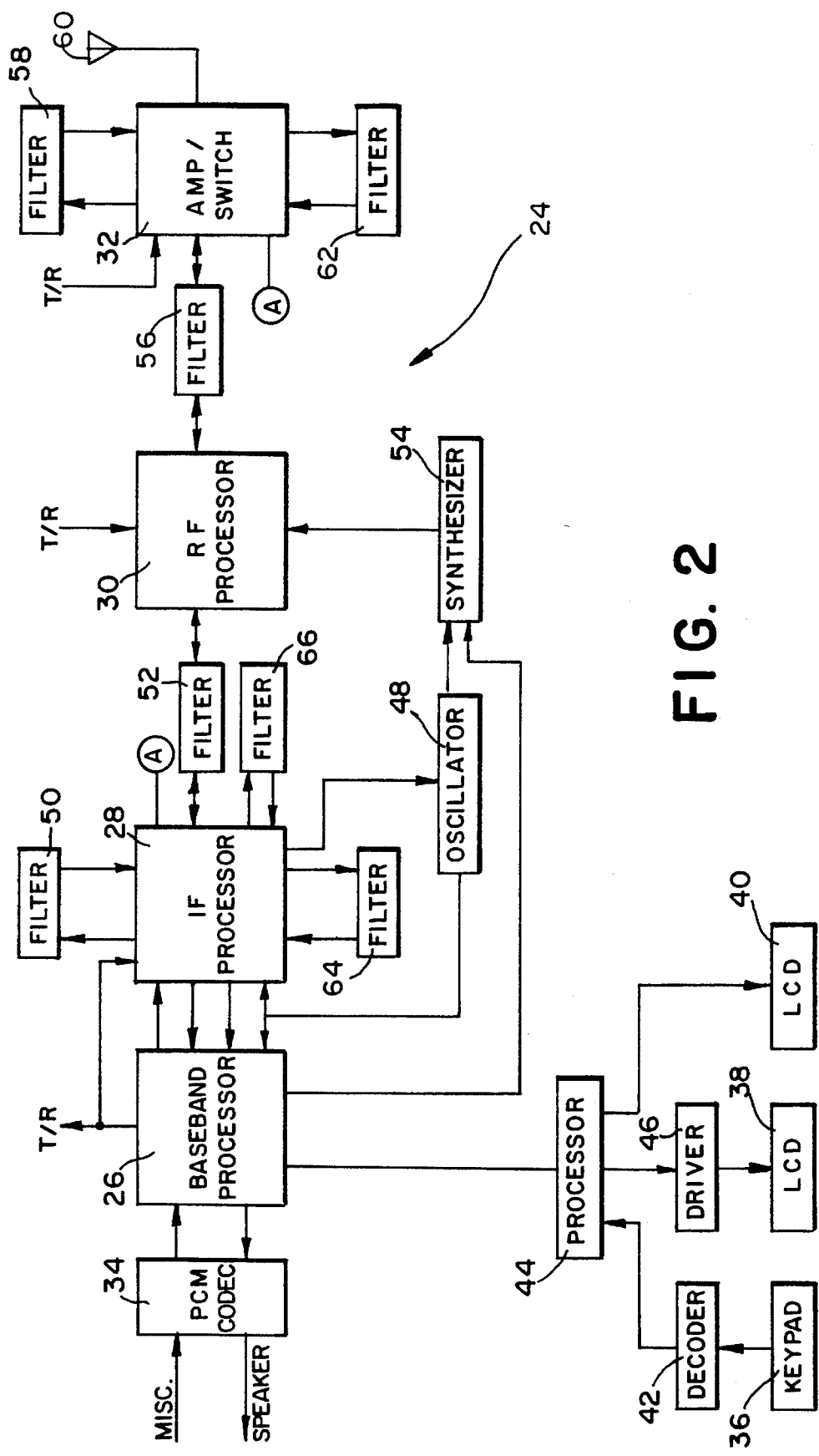
FIG. 2 is block diagram of the core components of a portable station depicted in FIG. 1.

Referring now to FIG. 2, the core of portable station 24 is an integrated circuit chip set including chips or processors 26, 28, 30 and 32. In order to get a better understanding of the use of the present invention in a cordless telephone, consider briefly, the operation of processors 26 through 32 during a transmit and receive operation. During transmission, base band processor 26 receives a voice representative signal, for example a signal produced by a microphone, and operates to convert the voice signal into a digital signal having a desired form, i.e., a differential π/4-QPSK signal. The digital signal is provided to intermediate frequency (IF) processor 28 which converts the digital signal into an analog signal and modifies the frequency of the analog signal upward to an intermediate frequency. The intermediate frequency signal is provided to radio frequency (RF) processor 30. RF processor 30 further modifies the frequency of the intermediate frequency signal upward to the radio frequency desired for transmission, i.e., the intermediate frequency is modified to the radio frequency of a desired channel. The radio frequency signal is provided to amp/switch chip 32. During transmission, chip 32 amplifies the radio frequency signal and provides that amplified signal to an antenna for transmission to base station 14.

During reception, a signal received at the antenna is provided to IC 32 which passes the received signal to RF processor 30. It will be recalled that the Japanese specification calls for each channel to be separated by approximately 300 kHz and for all channels to fall within a bandwidth between 1,895 MHz and 1,918 MHz. RF processor 30 selects a desired channel by down converting or heterodyning the received radio frequency signal so that the desired channel is at an intermediate frequency, preferably the same intermediate frequency used during transmission. The received intermediate frequency signal is passed through a bandpass filter, tuned to the intermediate frequency, so that all channels except the desired channel are removed. The resulting desired channel, now down converted to the intermediate frequency, is provided to IF processor 28. IF processor 28 further down converts the frequency of the intermediate frequency signal, preferably a two step or dual down conversion, and generates a digital signal representative of the down converted received signal. The digital signal generated by IF processor 28 is provided to base band processor 26 for conversion into a voice signal.

Consider now the transmit operation of portable station 24 in greater detail. A microphone (not shown) provides an analog voice signal to pulse code modulation (PCM) codec 34. Codec 34 converts the analog voice signal into a pulse code modulated signal. Codec 34 can be any known device for converting analog voice signals into PCM signals. The PCM signal is provided to base band processor 26.

It is noted that various peripheral devices are utilized in order to enable the transmit operation. In particular, keypad 36, liquid crystal display (LCD) 38 and light emitting diodes (LED) 40 are used to initiate transmission. Keypad 36 is operative through decoder 42 to provide appropriate dialing or keying signals to processor 44. Processor 44 in turn operates LCD 38 through driver 46 and is shown to enable LED 40 directly. Processor 44 in turn interacts directly with base band processor 26. A master oscillator 48 provides a master clock signal to processors 26 and 28. In the preferred embodiment, the frequency of the master clock signal is 19.2 MHz.

Processor 26 converts the PCM signal to a digital signal having a repetition rate of approximately 1.152 MHz, and interpolates the digital signal at an effective sampling rate of 9.6 MHz. The output of base band processor 26 is a series of digital samples representative of a modulated carrier signal having a frequency of 10.752 MHz. The samples are provided to IF processor 28. IF processor 28 converts the samples into an analog IF signal in an internal digital-to-analog converter and thereafter filters the analog signal through bandpass filter 50. The filtered signal is provided back to IF processor 28 whereupon it is mixed with a local oscillator signal having a frequency of 259.2 MHz. The resulting signal, having a frequency of 248.448 MHz is thereafter passed through bandpass filter 52.

The output of band pass filter 52 is provided to RF processor 30 whereupon it is again mixed with a signal having a particular frequency. The object of this final mixing operation is to fix the frequency of the signal to be transmitted at the center frequency for a desired channel. The reference signal which is utilized in this final mixing step is generated by synthesizer 54. It will be recalled that this reference frequency is a multiple of 300 kHz. It is noted that 300 kHz is chosen in relation to the channel spacing requirements. After this final mixing stage, a signal having a frequency in the range between 1,895 MHz to 1,918 MHz, is passed through bandpass filter 56 to amplifier/switch IC 32. During a transmit operation, IC 32 passes the signal received from filter 56 through an internal amplifier, the output of which is connected to filter 58. After passing through filter 58, the signal to be transmitted is provided back to chip 32 where it is connected to antenna 60 for transmission. It is noted that the switching of processors 28, 30 and 32 between transmit and receive operations is controlled by a T/R control signal generated by processor 26.

Consider now the structure of portable station 24 during a receive operation. Base band processor 26 generates an appropriate receive control signal which is applied to processors 28, 30 and 32. Upon receipt of this signal, IC 32 switches antenna 60 into a receive path, whereupon the signal from antenna 60 is passed through filter 62 back into IC 32 and provided to bandpass filter 56. Bandpass filter 56 is thus shared for both transmission and reception operations.

The output of bandpass filter 56 is provided to RF processor 30 for selection of the desired channel. To this end the received signal is mixed in RF processor 30 with a signal generated by synthesizer 54. The desired channel or carrier frequency is selected as a result of a heterodyne operation. The frequency of the signal generated by frequency synthesizer 54 is such that the desired channel is centered at a frequency of approximately 248.448 MHz. The output from RF processor 30 is passed through bandpass filter 52 and provided to IF processor 28. Passing the output of RF processor 30 through filter 52 ensures that only the desired channel is provided to IF processor 28. It is noted that bandpass filter 52 is shared for both transmission and reception operations.

IF processor 28, through a mixing operation, further reduces the frequency of the selected carrier to approximately 10.75 MHz. This signal is thereafter passed through bandpass filter 66. The selected carrier signal is thereafter subjected to a mixing operation in order to still further reduce the carrier frequency to 1.15 MHz. The resulting 1.15 MHz signal is passed through bandpass filter 64 and back to IF processor 28.

IF processor 28, preferably via a limiting-interpolation operation on the 1.15 MHz signal, generates a digital signal representative of the selected channel. The digital signal generated by IF processor 28 is provided to base band processor 26 whereupon it is demodulated and converted into a PCM signal and provided to codec 34. Codec 34 thereafter converts the PCM signal into an analog signal which is provided to a speaker (not shown) for reproduction.

Figure 3:
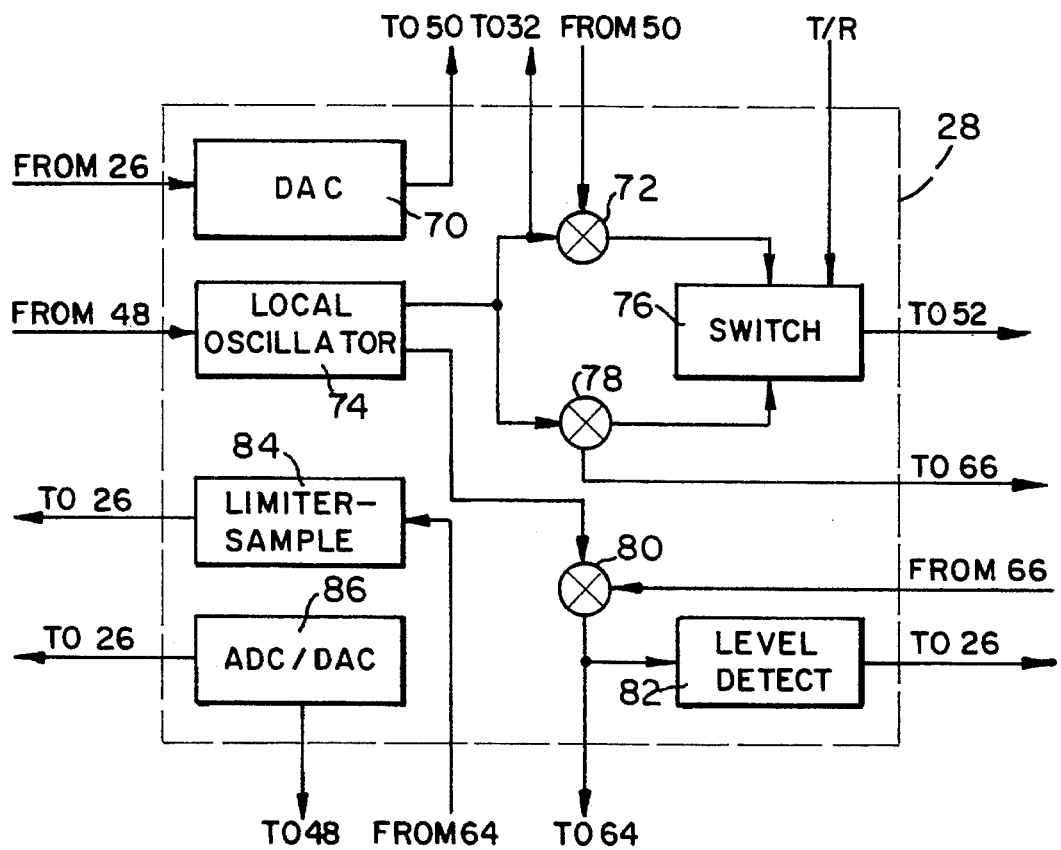
FIG. 3 is a generalized schematic diagram of the IF processor block depicted in FIG. 2.

Referring now to FIG. 3, the general construction of IF processor 28 will be described in greater detail. The series of digital samples generated by a modulator contained within processor 28 is provided to digital to analog converter 70. Converter 70 converts the series of digital samples into a modulated analog signal having a carrier frequency of approximately 10.752 MHz and modulated in accordance with information provided by processor 28. During a transmit operation, this analog signal is passed through band pass filter 50 and provided to mixer 72. The 10.752 MHz is mixed with a signal generated by local oscillator 74. The frequency of the signal generated by oscillator 74 in the preferred embodiment is approximately 259.2 MHz. Since the transmit operation is occurring, the T/R signal generated by base band processor 26 is indicating transmit. Accordingly, switch 76 is switched to transmit the output of mixer 72 to band pass filter 52.

During a receive operation, the analog signal passing through band pass filter 52 representative of the desired channel selected at RF processor 30, is provided to switch 76. The T/R signal will be indicating receive during a receive operation. Accordingly, switch 76 will provide the desired channel received from filter 52 to mixer 78. Mixer 78 mixes the received signal with the same 259.2 MHz signal generated by oscillator 74 producing an analog signal having a frequency of approximately 10.75 MHz. As indicated previously, this 10.75 MHz signal is passed through band pass filter 66.

After filtering, the desired channel, now having a carrier frequency of 10.75 MHz, is provided to mixer 80, where it is mixed with a 9.6 MHz signal resulting in an output signal having a frequency of approximately 1.15 MHz. The desired channel now having a carrier frequency of 1.15 MHz signal is provided to filter 64 and to level detector 82.

Level detector 82 senses the level of the desired channel and generates a signal level indication signal. This indication signal is provided to base band processor 26. Generally, the level indication signal will be used to control either the amplification or attenuation of the received signal in amp/switch chip 32. No particular level detector is necessary. However, in the preferred embodiment, the indication signal is a digital signal, i.e. either logic high or logic low, indicating that the received signal is above or below some desired level.

The output of filter 64 is provided to a limiter—sampler 84. The limiter—sampler generates a digital signal representative of the information contained in the 1.15 MHz signal received from filter 64. The digital signal generated by limiter—sampler 84 is provided to processor 26. An analog to digital and a digital to analog converter 86 is also provided in IC 28. Converter 86 operates to convert analog environment related information to digital data for provision to base band processor 26 and also operates to convert digital control signals provided by base band processor 26 into analog control signals provided, for example, to control oscillator 48.

It will be noted at this point, that the frequency of the signal generated by oscillator 48 is 19.2 MHz. In the preferred embodiment, all of the oscillator frequencies utilized in connection with processors 26, 28, 30 and 32 are integer multiples of 9.6 MHz, except for the frequencies of signals generated by synthesizer 54, which in the preferred embodiment are multiples of 300 kHz.

Figure 4:
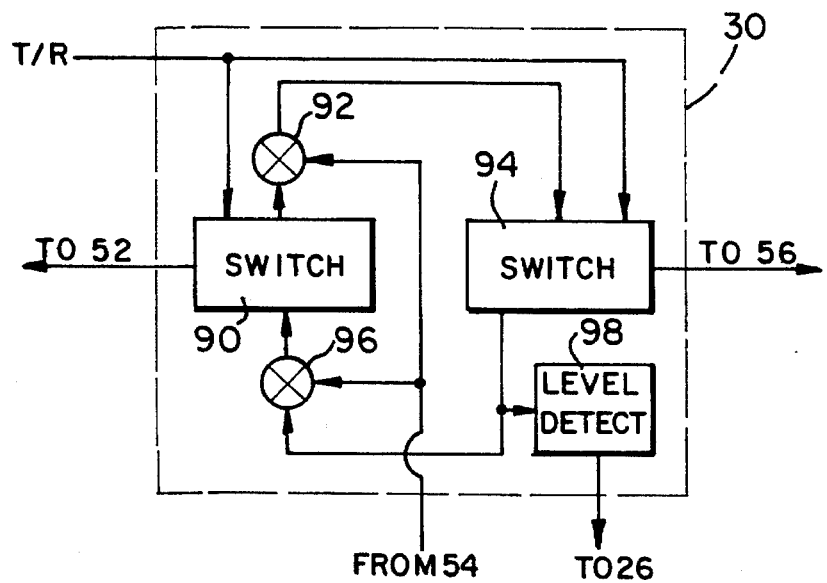
FIG. 4 is a generalized schematic diagram of the RF processor block depicted in FIG. 2.

Referring now to FIG. 4, the structure of RF processor 30 will be discussed in greater detail. During a transmit operation, analog signals passing through filter 52 are provided to switch 90. Switch 90 in turn provides the analog signal to mixer 92 where it is mixed with a signal generated by frequency synthesizer 54. It will be recalled that the frequency of signals generated by synthesizer 54 are fixed so that the output of mixer 92 is at a desired channel in the DCT system, i.e., having a carrier frequency between 1,895 MHz and 1,918 MHz. The output of mixer 92 is provided to switch 94 which during the transmit mode is switched to provide this analog signal to filter 56. Similar to mixer 78, mixer 92 is preferably a single sideband up converter which provides image rejection.

During a receive operation, the signal present on antenna 60 is provided through filter 56 to switch 94. Switch 94 in the receive mode is switched to provide the receive signal to mixer 96 where it is mixed with a signal generated by synthesizer 54. The heterodyne technique used in conjunction with mixer 96 serves to select one channel of the several channels received by antenna 60. The selected channel is provided to switch 90 which in turn passes the selected channel to filter 52.

The signal provided to mixer 96 is also provided to level detector 98. Detector 98 senses the level of the received signal and generates a signal level indication signal. This indication signal is provided to base band processor 26. Generally, the level indication signal, similar to that generated by detector 82, will be used to control either the amplification or attenuation of the received signal. No particular level detector is necessary, however, in the preferred embodiment, the indication signal is a digital signal, i.e. either logic high or logic low indicating that the received signal is above or below some desired level.

Figure 5A:
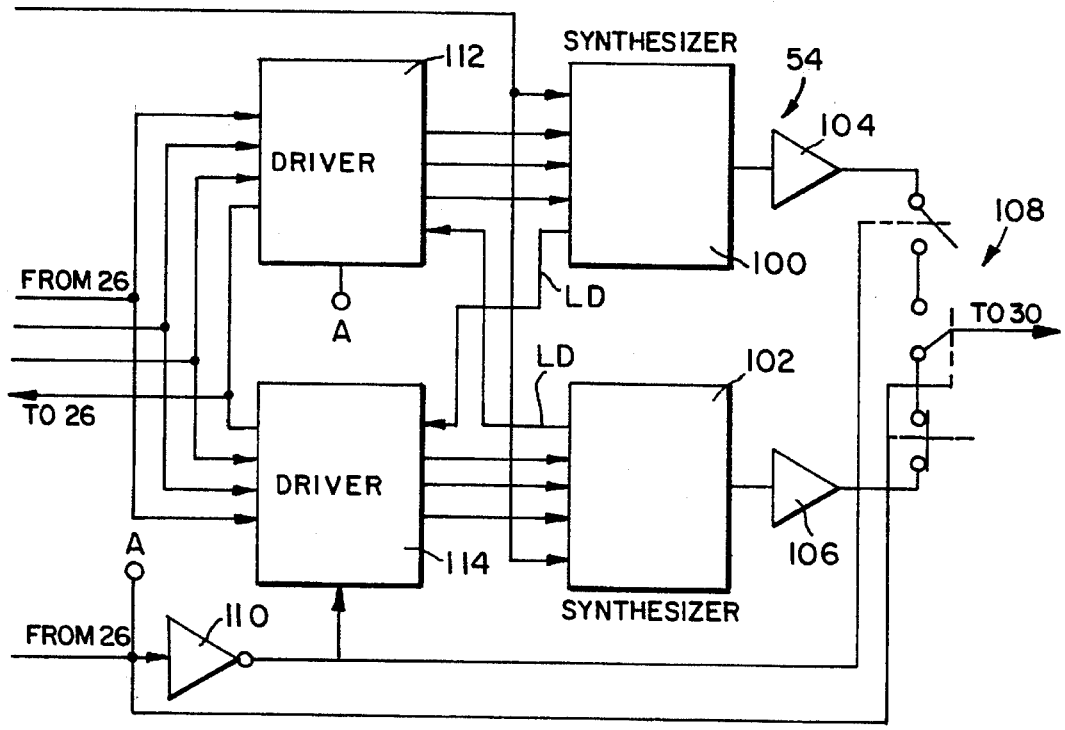
FIG. 5A is a block diagram of an embodiment of the synthesizer block shown in FIG. 2, depicting the use of two synthesizer chips constructed in accordance with the present invention.

Referring now to FIG. 5A, synthesizer 54 will be described in greater detail. In order to reduce the time necessary to switch from one frequency to the next, synthesizer 54 includes a pair of synthesizers or frequency generators 100 and 102. The outputs of generators 100 and 102 are amplified by amplifiers 104 and 106 and then provided to switch 108.

By providing a pair of frequency generators 100 and 102, the time necessary for each generator to provide a stabilized output is extended significantly. In the worst case for the TDD format described previously, the time for each synthesizer to generate a stabilized output frequency is approximately 625 μs. Although, no specific switch is required for switch 108, it must be capable of switching within the time existing between TDMA frames, i.e., for a DCT application in accordance with the Japanese Standard switching must occur within the 30 μs time limit described previously.

Switch 108 is operated in response to a switching signal generated by base band processor 26. The switching signal is provided to inverter 110, so that both the switching signal and the complement of the switching signal are provided to switch 108. Switch 108 is shown to include three switching portions. The inverted signal is provided to that portion of switch 108 connected to receive the output of synthesizer 100, while the non-inverted switching signal is provided to that portion of switch 108 connected to receive the output of synthesizer 102. The non-inverted switching signal is also provided to that portion of switch 108 that connects one of the other two portions to synthesizer 54 output. The switching signal is preferably digital in nature, i.e., either logic "high" or logic "low." In response to the switching signal, the output of either one or the other of generators 100 and 102 will be connected to the output of synthesizer 54.

Figure 5B:
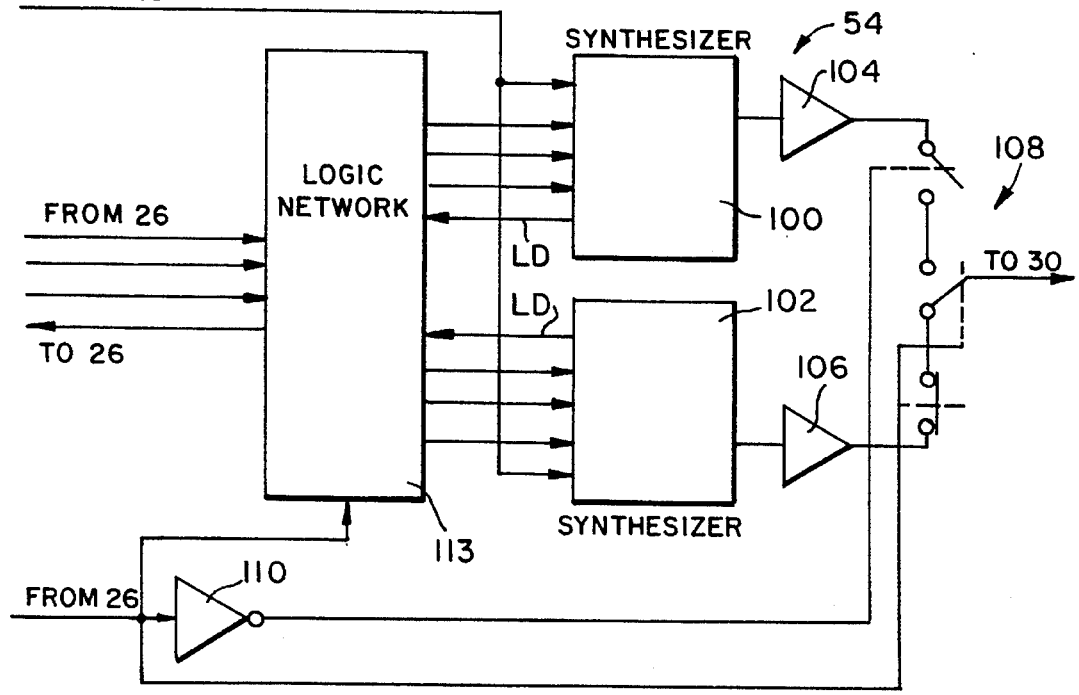
FIG. 5B is a block diagram of an alternative embodiment of the synthesizer shown in FIG. 5A.

Although generators 100 and 102 include certain memory components, described in relation to FIG. 7 below, synthesizer 54 also includes either tri-state driver devices 112 and 114 or logic network 113 (FIG. 5B). Drivers 112 and 114 are interposed between the memory components of generators 100 and 102 and act as open circuits until such time as information generated by processor 26 is to be provided to a particular generator. Drivers 112 and 114 are connected to provide the tri-state or high impedance state until such time as they are enabled. Driver enablement is keyed to the switching signal generated by processor 26 so that when one generator is switched to provide the output for synthesizer 54 the driver associated with the other generator is enabled. To this end the inverted switching signal is provided to driver 114, while the non-inverted switching signal is provided to driver 112. For example, if processor 26 generates a switching signal so that the output of generator 102 is provided by switch 108 to the output of synthesizer 54, that same switching signal will enable driver 112, thereby allowing data to pass to generator 100.

As will be described in greater detail below, each generator 100 and 102 generates a lock detect signal (LD) indicating that a desired frequency has been "locked" by a particular generator. It is desirable for processor 26 to keep track of such lock detect signals. FIG. 5 shows that the lock detect signals for generator 102 is connected to driver 112 while the lock detect signal for generator 100 is connected to driver 114. Such an arrangement assures that the lock detect signal will be provided to processor 26 while a given generator 100 or 102 is providing the output for synthesizer 54.

Referring now to FIG. 5B, an alternative embodiment is disclosed to the synthesizer arrangement shown in FIG. 5A. In this alternative embodiment, the tri-state drivers have been replaced with logic network 113. Essentially the logic network comprises a series of gates, such as AND gates, wherein certain gates are associated with each generator 100 and 102. It will be appreciated that a gating signal applied to the gates concurrently with the information provided by processor 26 will allow information to pass or not pass through the gate. In this embodiment gating is keyed to the switching signal generated by processor 26, wherein one generator has information gated to it when the gating signal is "high" and the other generator receives information when the gating signal is "low."

Figure 6:
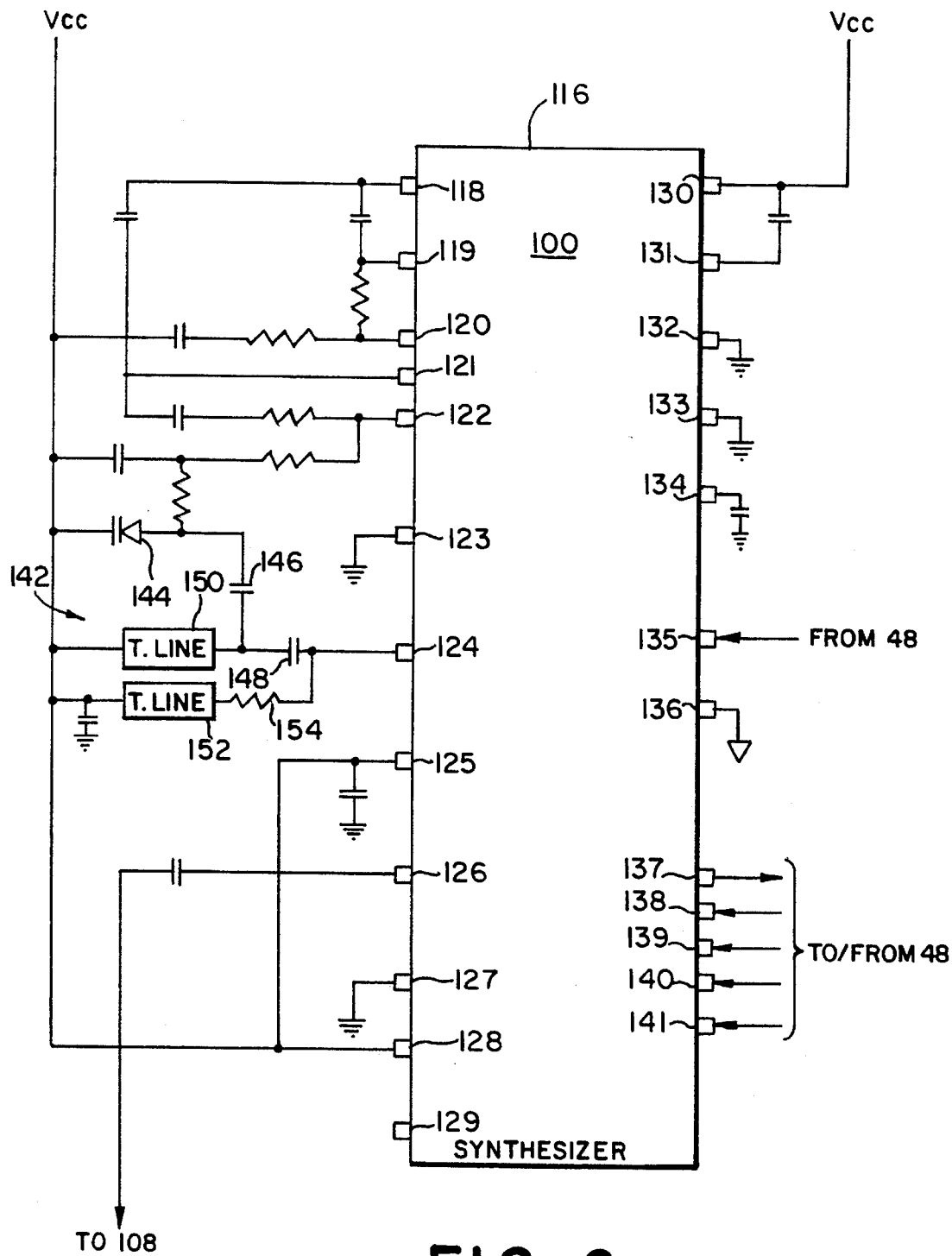
FIG. 6 is a schematic diagram showing in greater detail the implementation of one of the synthesizer integrated circuit chips depicted in FIG. 5.

Referring now to FIG. 6, generators 100 and 102 will be described. Since generators 100 and 102 are preferably identical in construction, only generator 100 is shown. It is noted that generator or synthesizer 100 is depicted as a dual-in-line-pin (DIP) device 116 the contents of which will be described in greater detail in relation to FIG. 7. DIP 116 includes a number of pins 118–141, which pins are attached to various portions of the chip.

Generally, device 116 is constructed in a type of phase lock loop configuration wherein a reference signal is compared to the output of a voltage controlled oscillator. The voltage for controlling the oscillator is generated based upon any phase difference between the reference and the oscillator output.

A tank circuit 142 is shown in FIG. 6, connected to pin 124 which constitutes the input for the voltage controlled oscillator. It will be appreciated that tank circuits are utilized in order to balance any reactive (imaginary) components present in the oscillator. Tank circuit 142 includes varactor 144, capacitors 146 and 148, transmission line elements 150 and 152 and resistor 154. It will be recognized that the transmission line elements are selected in relation to their predetermined electrical length and impedance. In this particular tank circuit, voltage output from pin 122 is passed through tank circuit 142 before provision to pin 124. As the voltage across varactor 144 changes the reactance of the tank changes, thereby balancing any reactive components present in the oscillator. In device 116, pin 126 is the oscillator output.

Figure 7:
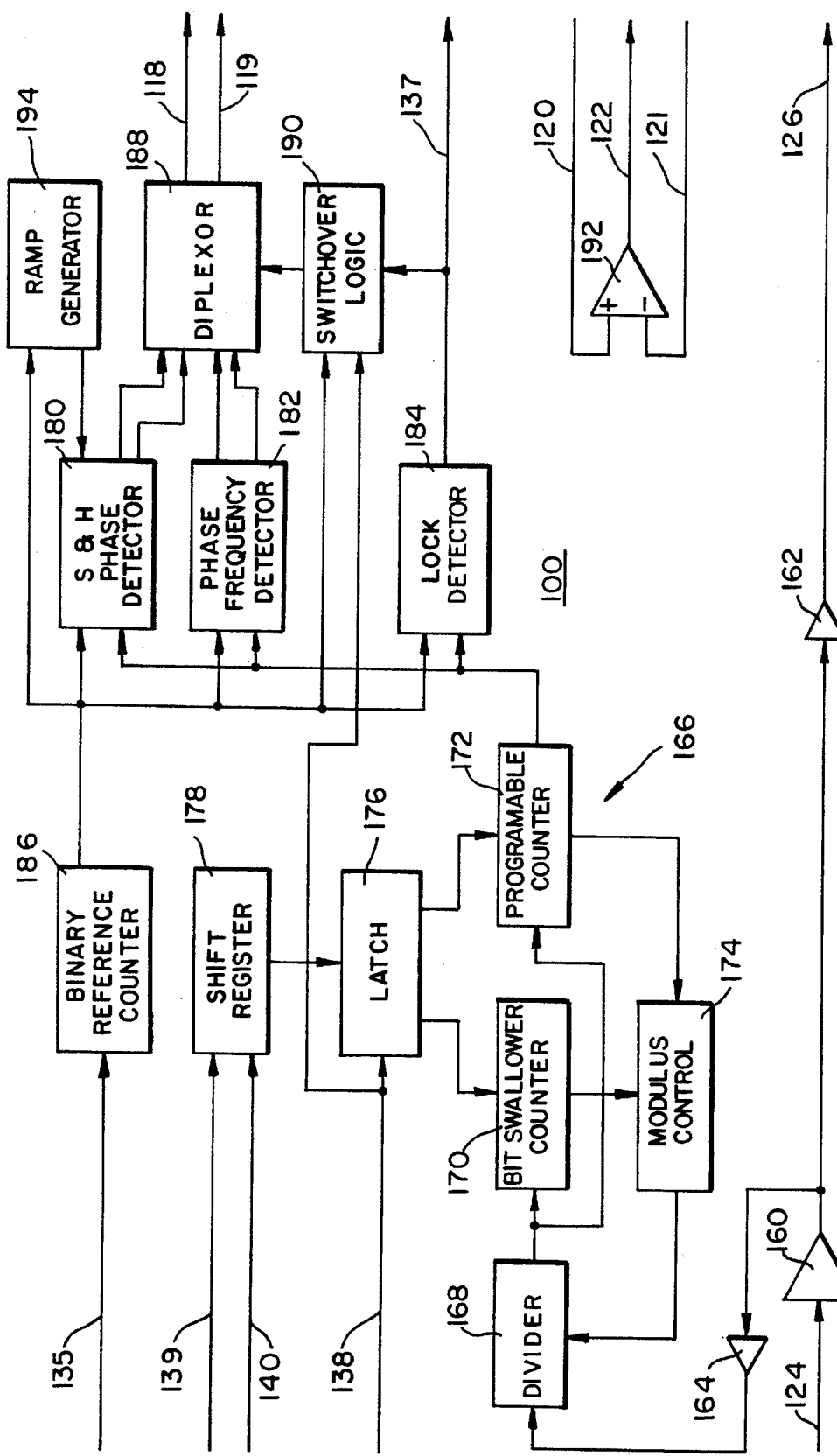
FIG. 7 is a block diagram of the integrated circuit chip shown in FIG. 6.

Referring now to FIG. 7, synthesizer 100 will be described in greater detail. It is noted that the pins depicted in FIG. 6, have been identified with like numerals in FIG. 7 where output and input lines correlate to the pins. As indicated previously, synthesizer 100 is of a type similar to a phase locked loop. For purposes of discussion, it is assumed that synthesizer 100 is to be used in a DCT context so that it is desired to generate frequencies in the range from 1.895 GHz to 1.918 GHz.

Voltage controlled oscillator 160 is designed to generate signals having frequencies within the desired range, wherein the actual frequency within that range is determined by the voltage applied to oscillator input 124. Signals generated by oscillator 160 are passed through buffer 162 before being output at 126. The output of oscillator 160 is also provided to buffer 164 after which it is presented to frequency divider circuit 166.

Although no particular frequency divider is required to practice the invention, it is necessary for the frequency divider to be accurate enough to divide the output of oscillator 160 (GigaHertz) so that frequencies can be generated having 300 kilohertz separation. It will be recalled from above that in the Japanese standard the channels specified for use in the DCT system fall within the frequency band of 23 MHz each separated by 300 kHz.

In the preferred embodiment, frequency divider circuit 166 is a dual modulus frequency divider including divider 168, bit swallower counter 170, programmable counter 172 and modulus controller 174. Dividers of the type shown in FIG. 7 are known and will not be described in great detail here. It will be understood that in circuits of this type, divider 168 will divide the oscillator output by an integer number equal to either M or M+1. The selection of M or M+1 is made by the modulus controller. It is noted that the value of M is set in advance and is preferably equal to 64.

Bit swallower counter 170 is preferably a 6 bit device which acts to divide the output of divider 168 by an integer value "A" and provides an output signal to the modulus controller. Programmable counter 172 is preferably a 7 bit binary program counter which also divides the output of divider 168 by an integer value "N." The output of counter 172 will be the oscillator output divided down to a desired level. It will be appreciated that if the output of counter 172 is at the correct frequency, then oscillator 160 is generating a signal having the desired frequency. The values of "A" and "N" are provided by latch 176, which in turn receives the values from shift register 178. Shift register 178 receives the values of A and N from base band processor 26 via pins 139 and 140.

The output of divider circuit 166 is provided to three detectors, namely, sample and hold phase detector 180, phase frequency detector 182 and lock detector 184. A reference signal is generated by passing the signal output from voltage controlled crystal oscillator 48 through binary reference counter 186. This reference signal is also provided to detectors 180, 182 and 184. In the preferred embodiment, counter 186 is a binary 6-bit reference counter.

Detectors 180 and 182 are designed to provide differential outputs indicative of the differences in phase or phase/frequency between the divided oscillator signal and the reference signal. Signals of this type steer the oscillator output in a desired frequency direction. Whether the signals output from detectors 180 and 182 are indicative of a lead or lag phase difference situation, can only be determined by comparing the value of each output. One output having a greater value than the other can be indicative of a leading phase difference where the other output having a greater value would indicate a lagging phase difference. The outputs of detectors 180 and 182 are provided to diplexor 188 which performs a switching function in that only one set of outputs from either detector 180 or detector 182 will be output from diplexor 188. Diplexor 188 is operative in relation to a control signal from switchover logic 190. When diplexor 188 receives a control signal from switchover logic 190, it will switch between outputs from detectors 180 and 182. In other words, when diplexor 188 receives a "switch" signal, it stops outputting the outputs from one detector and begins outputting the outputs from the other detector.

In the preferred embodiment, diplexor 188 is a tri-state based device, wherein tri-state devices associated with a particular detector either pass the outputs through as the output of diplexor 188 or a high impedance state will be present. In this manner the signal from switchover logic 190 selects which detector outputs will be provided as the outputs of diplexor 188.

The differential signals output from diplexor 188 are provided as inputs to operational amplifier 192. Operational amplifier 192 can be of any suitable design, however, it is preferable for both proportional and integral components to also be taken into account. By using differential signals, spurious noise and other problems can be avoided. The output of amplifier 192, a voltage generally reflective of the degree of difference between the inputs, including proportional and integral components, is passed to the tank circuit and the proper impedance is provided to the input of oscillator 160.

Consider synthesizer 100 during operation. Assume that synthesizer 100 is used in a DCT within the Japanese system, and that it is necessary to generate a synthesized signal having a particular frequency in order to up convert, in RF processor 30, a transmit signal to the frequency of a desired channel. Processor 26 generates the necessary "A" and "N" information and provides this information to pin 139. A clock signal is provided to pin 140. The "A" and "N" information is shifted into register 178 and provided to latch 176 upon receipt of an appropriate latch enable signal at pin 138. The latch enable signal is also generated by processor 6. Once latch 176 is enabled, the "A" and "N" information is provided to counters 170 and 172. The provision of this information acts to modify the ratio by which the oscillator output is to be divided. The divided oscillator output signal is provided to detectors 180, 182 and 184.

It is noted that the latch enable signal provided by processor 26 to pin 138 is also provided to switchover logic 190. Receipt of this signal acts to cause switchover logic 190 to generate a control signal switching the signals to be output from diplexor 188, so that the signals generated by detector 182 are now output. Detector 182 is a differential phase frequency detector which can be of any known construction. Detector 182 determines the difference between the frequency and phase of the reference signal and the divided oscillator signal. The outputs from detector 182 are provided to operational amplifier 192 which in turn generates a voltage reflective of the difference between the signals output by detector 182, thereby changing the frequency of the signal output by oscillator 160.

As the phase of the divided oscillator input reaches the reference phase, lock detector 184 begins to detect a lock condition. A lock condition exists where the differences between phase of the divided oscillator signal and the phase of the reference signal fall below some threshold. In response to determining that a lock condition exists, lock detector 184 outputs a signal indicative of the lock condition. This lock detect signal is provided to switchover logic 190 and to processor 26, via pin 137. When switchover logic 190 has received a predetermined number of lock detect signals, a control signal is generated causing diplexor 188 to now output the lead and lag signals generated by sample and hold phase detector 180. In the preferred embodiment, the number of lock detect signals necessary to cause the switchover logic to generate the control signal is 7.

It is noted that the output of binary reference counter 186 is connected to switchover logic 190. In the preferred embodiment, after being enabled, switchover logic 190 samples the output of lock detector 184 in response to receiving pulses from counter 186. If the output of detector 184 indicates a lock condition for 7 consecutive pulses from counter 186, then switchover logic 190 causes the generation of the control signal for diplexor 188 to now output the differential signals from sample and hold phase detector 180.

In the preferred embodiment, lock detector 184 is a phase frequency detector, similar to detector 182, however the differences between phase and frequency are used internally to determine whether a lock condition has occurred. Although not shown, it is preferred for the differential signals generated in relation to the phase difference to be sampled at a rate higher than the frequency of the reference signal and for the samples to be compared to determine whether they are the same or whether any difference falls below some threshold value.

Sample and hold phase detector 180 compares the phase differences between the divided oscillator signal and the reference signal by using each signal to sample a ramping voltage. The sampled voltage values are held in the detector and output as the differential signals to diplexor 188. The ramping voltage sampled by detector 180 is generated by ramp generator 194. The operation of ramp generator 194 is described in greater detail in relation to FIG. 8.

It is noted that utilizing both detectors 180 and 182 in the fashion described produces two beneficial results. The time to produce a stabilized output signal is reduced because the phase frequency detector will lock relatively quickly and reliably and the sample and hold detector will maintain the lock condition more accurately. Consequently, the speed of a phase frequency detector and the accurateness of a sample and hold detector are both realized in the present invention.

Figure 8:
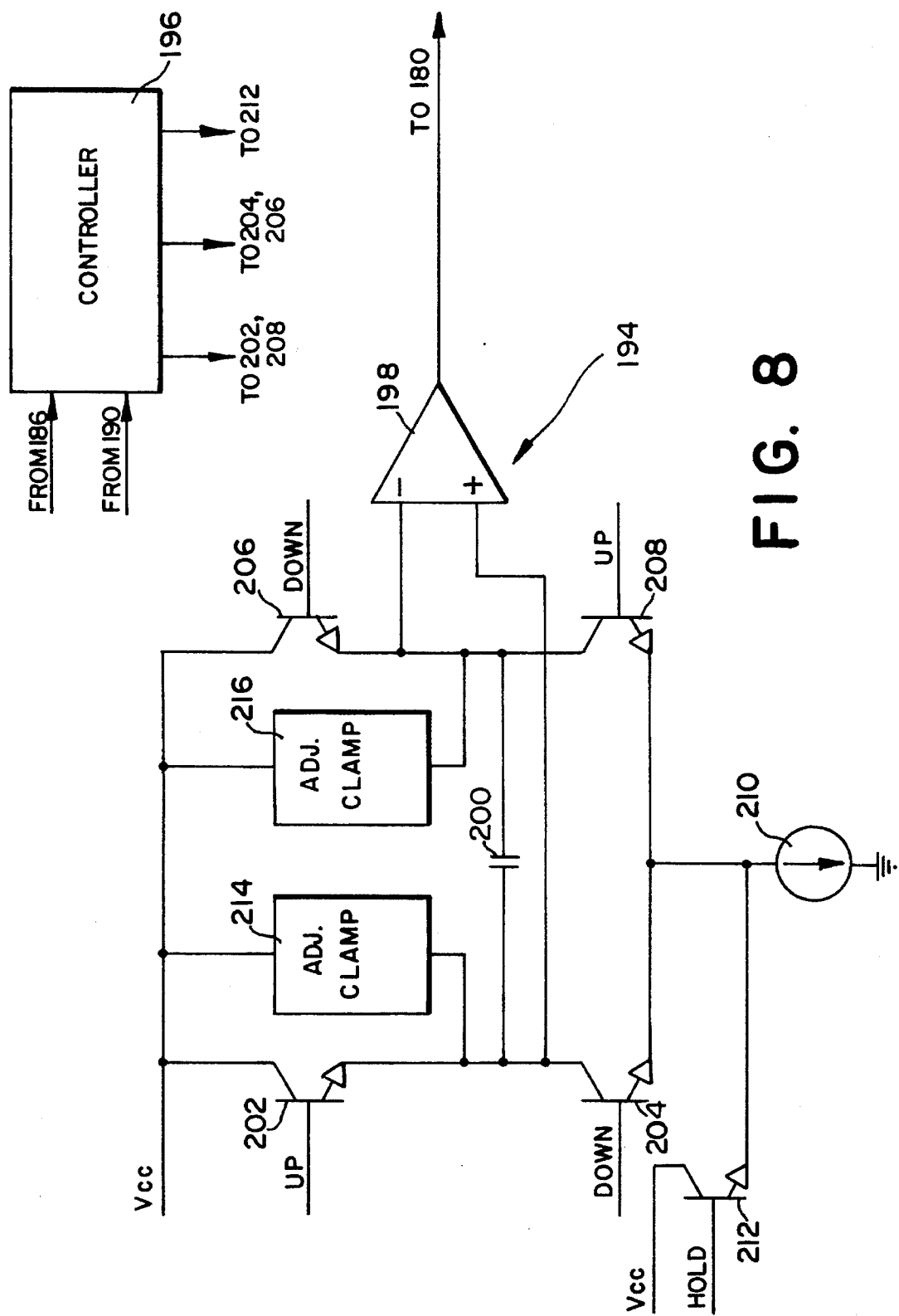
FIG. 8 is a schematic diagram of the RAMP block shown in FIG. 7.

Referring now to FIG. 8, ramp generator 194 is shown in greater detail. Although a specific ramp generator is shown, any circuit for producing a ramped voltage within the time periods necessary, i.e. within the period of the reference signal, will be adequate. In the preferred embodiment, ramp generator 194 is a single ended ramp generator combined with a single ended differential converter. The output of this combination is then sampled to produce the outputs of detector 180.

The purpose of generator 194 is to generate a ramping voltage which if sampled at different points in time will yield different voltage values. Since the ramping function will be sampled at a rate equal to the rate at which phase differences are to be detected in phase detector 180, it is desirable to repeat the ramp function for each phase determination. The ramp function output from generator 194 repeats at the rate pulses are produced from, i.e., the output frequency of, reference counter 186.

As shown in FIG. 8, the output of counter 186 is provided to ramping controller 196. Controller 196 generates control signals for generating the ramping voltage output from amplifier 198. Amplifier 198 has its inputs connected across capacitor 200. The voltage across capacitor 200 is caused to ramp up and down by a series of switching transistors. Transistors 202 and 204 are connected in series as are transistors 206 and 208. The collector end of each transistor 202 and 206 are connected to $V_{cc}$ while the emitter end of each of transistors 204 and 208 are connected to current source 210. Capacitor 200 is connected between the series connections of transistors 202–208. A hold transistor 212 has its collector connected to $V_{cc}$ while the emitter is connected to current source 210. The bases of all transistors are connected to controller 196. Adjustable clamps 214 and 216 are connected across transistors 202 and 206, respectively, to keep the ramped voltage within desired limits.

By regulating the time during which the transistors are ON and OFF, a ramping up, ramping down and holding voltage at zero can be achieved. Actually, the voltage across capacitor 200 is caused to ramp up and down by regulating the ON/OFF cycles of transistors 202–208. When UP transistors 202 and 208 are ON and all other transistors are OFF, the voltage across capacitor 200 ramps up. When DOWN transistors 204 and 206 are ON and all other transistors are OFF, the voltage across capacitor 200 ramps down. When HOLD transistor 212 is ON and all other transistors are OFF, capacitor 200 is drained, i.e., the voltage across capacitor 200 will be zero. Such a situation preferably occurs when detector 182, after sampling the ramping voltage is generating its output signals to diplexor 188. Table 1 below summarizes the signals generated by controller 196 during various periods.

TABLE I

| UP | DOWN | HOLD | OUT |
| --- | --- | --- | --- |
| 1 | 0 | 0 | RAMPING UP |
| 0 | 1 | 0 | RAMPING DOWN |
| 0 | 0 | 1 | HOLD |

In operation, detector 180 samples the output of generator 194 preferably during the time voltage is ramping down, i.e. during the time the voltage across capacitor 200 is decreasing and generates lead lag signals in relation to the sampled voltage for provision to diplexor 188 during a hold period.

While the invention has been described and illustrated with reference to specific embodiments, those skilled in the art will recognize that modifications and variations may be made without departing from the principles of the invention as described hereinabove and set forth in the following claims.

What is claimed is:

1. A frequency synthesizer for generating an output signal of a predetermined frequency, wherein said synthesizer is provided with a reference signal, said synthesizer comprising:

an oscillator for generating said output signal in response to a control signal;

a first detector for comparing said output signal to said reference signal and for generating a first difference signal representative of differences between said output and reference signals;

a second detector for comparing said output signal to said reference signal and for generating a second difference signal representative of differences between said output and reference signals;

a controller for generating said control signal in response to either said first or second difference signal;

a selector, connected to said first and second detectors and said controller, for selecting between said first and second difference signals and for outputting the selected difference signal to said controller in response to a selection signal;

a lock detector, connected to receive said output signal, for detecting when said output signal and said reference signal are in a predetermined relation and for generating said selection signal in response to said lock detector detecting the occurrence of said predetermined relation; and wherein said lock detector generates a signal representative of a lock condition and further comprising a selection signal generator circuit for generating said selection signal when said lock condition is indicated for a predetermined number of periods.

2. The synthesizer of claim 1, wherein said first detector comprises a phase/frequency detector for detecting both phase and frequency differences between said output signal and said reference signal, wherein said first difference signal is representative of phase and frequency differences.

3. The synthesizer of claim 1, wherein said first and second difference signals comprises differential components the difference of which is reflective of phase difference.

4. The synthesizer of claim 1, further comprising a divider, connected between said oscillator and said first and second detectors, for modifying the frequency of said output signal by a predetermined ratio.

5. The synthesizer of claim 4, wherein said divider comprises a dual modulus frequency divider.

6. The synthesizer of claim 1, wherein said lock detector comprises a phase frequency detector and wherein said selection signal is generated in response to the detection of predetermined phase differences.

7. The synthesizer of claim 1, wherein said first and second difference signals are differential signals having first and second components and wherein said controller comprises an operational amplifier connected to receive said first and second components.

8. The synthesizer of claim 1, wherein said selector circuit is connected to receive said reference frequency and wherein said switching is operative to sample said signal representative of a lock condition.

9. The synthesizer of claim 1, further comprising a tank circuit, connected between the controller and the oscillator, for balancing reactive components present in the oscillator.

10. The synthesizer of claim 1, wherein said second detector comprises a sample and hold detector for detecting the phase difference between said output signal and said reference signal.

11. The synthesizer of claim 10, further comprising a ramp generator for generating a ramping voltage, wherein said second detector detects phase differences by sampling said ramping voltage in response to each of said reference signal and said output signal.

12. The synthesizer of claim 1, wherein said oscillator, said first and second detectors, said controller said selector and said lock detector are formed on a single integrated circuit.

13. A frequency synthesizer for generating an output signal of a first frequency and thereafter generating an output signal of a second frequency in response to a control signal, wherein said synthesizer has an output, said synthesizer comprising:

a first frequency generator for generating a first synthesized signal at a first frequency;

a second frequency generator for generating a second synthesized signal at a second frequency;

a switch, connected to said first and second frequency generators and to said output, for switching between said first and second frequency generators in response to said control signal to provide a signal at either said first or second frequency to said output, one of the first frequency generator and the second frequency generator comprising:

an oscillator for generating the synthesized signal of the generator in response to an oscillator control signal, a first detector for comparing the synthesized signal of the generator to a reference signal and for generating a first difference signal representative of differences between said synthesized and reference signals, a second detector for comparing the synthesized signal of the generator to said reference signal and for generating a second difference signal representative of differences between said synthesized and reference signals, an oscillator controller for generating the oscillator control signal in response to either said first or second difference signal, a detector selector, connected to said first and second detectors and said oscillator controller, for selecting between said first and second difference signals and for outputting the selected difference signal to said oscillator controller in response to a selection signal, a lock detector, connected to receive said synthesized signal, for detecting when said synthesized signal and said reference signal are in a predetermined relation and for generating said selection signal in response to said lock detector detecting the occurrence of said predetermined relation, and wherein said lock detector generates a signal representative of a lock condition and further comprising a selection signal generator circuit for generating said selection signal when said lock condition is indicated for a predetermined number of periods.

14. The synthesizer of claim 13, further comprising a controller for determining when to switch between said first and second frequencies and for generating said control signal in response to said determination to switch between said first and second frequencies.

15. The synthesizer of claim 14, wherein each of said first and second frequency generators are programmable so that the frequencies generated can be controlled by a programming signal and wherein said controller generates said programming signal.

16. The synthesizer of claim 13, wherein each of said first and second frequency generators further comprise a memory, wherein the frequencies generated by said first and second generators are determined by frequency information stored in the memory in each of said generators.

17. The synthesizer of claim 16, wherein the memories for each of said generators comprises tri-state drivers and shift registers, wherein data provided to said tri-state drivers is provided to said shift registers in response to an enablement signal.

18. The synthesizer of claim 16, wherein the memories for each of said generators comprises a gating logic network and shift registers.

19. The synthesizer of claim 13, wherein said first and second frequency generators and said switch are formed on a single integrated circuit.

20. A digital cordless telephone system, wherein a voice signal is provided and a transmitted signal is received via an antenna, said system comprising:

a base integrated circuit chip, connected to receive said voice signal, for converting said voice signal into a digital signal of a desired form;

an intermediate frequency integrated circuit chip, connected to said base chip, for converting said digital signal into an analog signal and for modifying the frequency of said analog signal, wherein during transmission the frequency of said analog signal is up converted to an intermediate frequency and wherein during reception said transmitted signal is down converted from said intermediate frequency to a lower frequency;

a radio frequency integrated circuit chip, connected to said intermediate frequency chip, for up converting during transmission the frequency of said analog signal from said intermediate frequency to a desired radio frequency and for down converting during reception said transmitted signal from a desired radio frequency to said intermediate frequency;

an amplifier integrated circuit chip, connected between said radio frequency chip and said antenna, said amplifier chip comprising transmission and receive paths, for amplifying said radio frequency signal during transmission and for switching said antenna between said transmit and receive paths; and a frequency synthesizer integrated circuit chip, connected to said radio frequency chip, for generating a reference signal for mixing with said radio frequency signal and said intermediate frequency signal in said radio frequency chip, wherein said frequency synthesizer chip comprises:

an oscillator for generating said output signal at said desired frequency in response to a control signal;

a first detector for comparing said output signal to said reference signal and for generating a first difference signal representative of differences between said output and reference signals;

a second detector for comparing said output signal to said reference signal and for generating a second difference signal representative of differences between said output and reference signals;

a controller for generating said control signal in response to either said first or second difference signal;

a selector, connected to said first and second detectors and said controller, for selecting between said first and second difference signals and for outputting the selected difference signal to said controller in response to a selection signal;

a lock detector, connected to receive said output signal, for detecting when said output signal and said reference signal are in a predetermined relation and for generating said selection signal in response to said lock detector detecting the occurrence of said predetermined relation; and wherein said lock detector generates a signal representative of a lock condition and further comprising a selection signal generator circuit for generating said selection signal when said lock condition is indicated for a predetermined number of periods.

21. A method for generating an output signal of a predetermined frequency in relation to a reference frequency, said method comprising the steps of:

generating said output signal, in response to a control signal;

comparing said output signal to said reference signal and generating a first difference signal representative of differences between said output and reference signals;

comparing said output signal to said reference signal and generating a second difference signal representative of differences between said output and reference signals;

generating said control signal in response to either said first or second difference signal;

selecting between said first and second difference signals while generating said control signal in response to a selection signal;

detecting when said output signal and said reference signal are in a predetermined relation and generating said selection signal in response to the detection of the occurrence of said predetermined relation;

wherein said predetermined relation is a lock condition and said selection signal is generated when said lock condition is indicated for a predetermined number of periods.

22. The method of claim 21, wherein said step of generating said first difference signal comprises the steps of detecting both phase and frequency differences between said output signal and said reference signal, wherein said first difference signal is representative of phase and frequency differences.

23. The method of claim 21, further comprising the step of dividing the frequency of said output signal by a predetermined ratio.

24. A method for generating an output signal of a first frequency and thereafter generating an output signal of a second frequency in response to a control signal, said method comprising the steps of:

generating a first synthesized signal at a first frequency;

generating a second synthesized signal at a second frequency;

switching between said first and second synthesizer signals in response to said control signal to provide a signal at either said first or second frequency to said output, one of the step of generating the first synthesized signal and generating the second synthesized signal comprising the steps of:

generating the synthesized signal of the generator in response to an oscillator control signal, comparing the synthesized signal to a reference signal and for generating a first difference signal representative of differences between said synthesized and reference signals, comparing the synthesized signal to said reference signal and for generating a second difference signal representative of difference between said synthesized and reference signals, generating the oscillator control signal in response to either said first or second difference signal, selecting between said first and second difference signals and for outputting the selected difference signal in response to a selection signal, detecting when said synthesized signal and said reference signal are in a predetermined relation and generating said selection signal in response to the occurrence of said predetermined relation, and generating a signal representative of a lock condition and further generating said selection signal when said lock condition is indicated for a predetermined number of periods.

* * * * *